United States Patent
Siewert et al.

(10) Patent No.: US 12,120,857 B2
(45) Date of Patent: Oct. 15, 2024

(54) ARRANGEMENT MADE UP OF COOLING DEVICE AND COOLING ARTICLE

(71) Applicant: Erwin Quarder Systemtechnik GmbH, Espelkamp (DE)

(72) Inventors: Georg Siewert, Pohlheim (DE); Alexander Heitbrink, Stemwede (DE)

(73) Assignee: Erwin Quarder Systemtechnik GmbH, Espelkamp (DE)

(*) Notice: Subject to any disclaimer, the term of this patent is extended or adjusted under 35 U.S.C. 154(b) by 178 days.

(21) Appl. No.: 17/741,804

(22) Filed: May 11, 2022

(65) Prior Publication Data
US 2022/0369497 A1   Nov. 17, 2022

(30) Foreign Application Priority Data

May 12, 2021  (DE) .......................... 102021112417.4

(51) Int. Cl.
*H05K 7/20* (2006.01)

(52) U.S. Cl.
CPC ......... *H05K 7/209* (2013.01); *H05K 7/20927* (2013.01)

(58) Field of Classification Search
CPC ........ H05K 7/1432; H05K 7/20; H05K 7/209; H05K 7/20218; H05K 7/20254–20263; H05K 7/2039; H05K 7/20427; H05K 7/20454; H05K 7/20509; H05K 7/20845; H05K 7/2089; H05K 7/20927–20936;
(Continued)

(56) References Cited

U.S. PATENT DOCUMENTS

| 6,111,749 A | 8/2000 | Lamb |
| 6,331,937 B1 * | 12/2001 | Bartyzel ............. H01L 23/4093 361/720 |

(Continued)

FOREIGN PATENT DOCUMENTS

| CN | 114038820 A * | 2/2022 |
| DE | 102007052397 A1 | 5/2009 |

(Continued)

OTHER PUBLICATIONS

CN-114038820-A English Translation (Year: 2022) (Year: 2022).*
(Continued)

*Primary Examiner* — Amir A Jalali
(74) *Attorney, Agent, or Firm* — Laurence P. Colton; Smith Tempel Blaha LLC

(57) ABSTRACT

An arrangement having a cooling device for dissipating heat from articles to be cooled which has at least one heat sink that has a heat absorption surface composed of metal and that is intended to absorb heat from one or more articles to be cooled, and also a cooling fluid chamber for accommodating cooling fluid to which the heat absorbed by the heat sink can be transferred, and having at least one article to be cooled which has a preferably planar heat emission surface composed of metal. To optimize the heat conduction between the heat sink and the article to be cooled, the heat absorption surface of the heat sink bears directly against the heat emission surface of the article to be cooled without an intermediate layer composed of air-displacing material, or, if necessary, with the use of an intermediate layer composed of air-displacing material that is thin.

18 Claims, 4 Drawing Sheets

(58) Field of Classification Search
CPC ...... H05K 2201/10166; H01L 23/3142; H01L 23/32; H01L 23/367; H01L 23/3672; H01L 23/40; H01L 23/4338; H01L 23/467; H01L 23/473; H01L 25/072; H01L 2023/4031; H01L 2023/4081–4087
See application file for complete search history.

(56) References Cited

U.S. PATENT DOCUMENTS

| | | | | |
|---|---|---|---|---|
| 6,504,242 | B1* | 1/2003 | Deppisch | H01L 24/31 257/714 |
| 7,203,065 | B1* | 4/2007 | Sin Yan Too | H01L 23/4006 361/709 |
| 7,535,715 | B2 | 5/2009 | Chung | |
| 8,900,704 | B1* | 12/2014 | Zinn | H01L 23/373 361/708 |
| 9,907,216 | B2* | 2/2018 | Park | H05K 7/20909 |
| 11,058,030 | B2* | 7/2021 | Tian | H05K 7/20772 |
| 2005/0136640 | A1* | 6/2005 | Hu | H01L 23/373 257/E23.102 |
| 2010/0140792 | A1 | 6/2010 | Haddon | |
| 2011/0286179 | A1 | 11/2011 | Motschman | |
| 2013/0214406 | A1* | 8/2013 | Schultz | H01L 23/46 257/713 |
| 2016/0290728 | A1* | 10/2016 | Coteus | H05K 7/20254 |
| 2018/0035529 | A1* | 2/2018 | Arai | F28F 21/02 |
| 2019/0259632 | A1* | 8/2019 | Isaacs | H01L 23/3677 |
| 2019/0301809 | A1* | 10/2019 | Cook | F28F 3/12 |
| 2020/0260613 | A1* | 8/2020 | Winkel | H05K 7/20209 |
| 2022/0142013 | A1* | 5/2022 | Zhou | F28F 3/12 361/702 |

FOREIGN PATENT DOCUMENTS

| | | |
|---|---|---|
| DE | 102010001958 A1 | 8/2011 |
| DE | 112019001566 T5 | 4/2022 |
| WO | 2005088713 A1 | 9/2005 |

OTHER PUBLICATIONS

Deutsches Patent—Und Markenamt (German Patent and Trademark Office), Recherchbericht, (search in a related application), Mar. 16, 2022.

Griesinger, A., Warmemanagement in der Elekronik, Berlin:Springer Vieweg, 2019.

* cited by examiner

ARRANGEMENT MADE UP OF COOLING DEVICE AND COOLING ARTICLE

CROSS REFERENCE TO RELATED APPLICATIONS

This patent application claims the benefit of and priority on German Patent Application No. 10 2021 112 417.4 having a filing date of 12 May 2021.

BACKGROUND OF THE INVENTION

Technical Field

The present invention relates to an arrangement comprising a cooling device for dissipating heat from articles to be cooled, such as power electronic modules, which has at least one preferably rigid heat sink that has a preferably planar heat absorption surface composed of metal and that is intended to absorb heat from one or more articles to be cooled, and also a cooling fluid chamber for accommodating cooling fluid, in particular cooling liquid, to which the heat absorbed by the heat sink can be transferred, and comprising at least one article to be cooled, in particular a power electronic module, which has a preferably planar heat emission surface composed of metal.

Prior Art

Such arrangements made up of article to be cooled and cooling device are known. In particular, but not exclusively, if the articles to be cooled are power electronic modules, it is often necessary to dissipate large quantities of heat energy that arise in a very small space as efficiently as possible so that the articles to be cooled are not damaged. In the prior art, the heat emission surface of the article to be cooled and the heat absorption surface of the heat sink are arranged so as to lie opposite one another, wherein, in order to optimize the heat transfer performance between the heat emission surface and the heat absorption surface, heat-conducting pastes of particular thickness are used, which prevent or displace air cushions between the surfaces that have an adverse effect on the heat conduction. However, the thermal conductivity of these heat-conducting pastes is subject to material-related limits.

BRIEF SUMMARY OF THE INVENTION

Proceeding therefrom, it is therefore an object of the present invention to further develop the arrangement mentioned in the introduction, in particular with a view to improved heat conduction between the heat emission surface and the heat absorption surface.

This object is achieved by means of an arrangement comprising a cooling device for dissipating heat from articles to be cooled, such as power electronic modules, which has at least one preferably rigid heat sink that has a preferably planar heat absorption surface composed of metal and that is intended to absorb heat from one or more articles to be cooled, and also a cooling fluid chamber for accommodating cooling fluid, in particular cooling liquid, to which the heat absorbed by the heat sink can be transferred, and comprising at least one article to be cooled, in particular a power electronic module, which has a preferably planar heat emission surface composed of metal, characterized in that, in order to optimize the heat conduction between the heat sink and the article to be cooled, the heat absorption surface of the heat sink bears directly against the heat emission surface of the article to be cooled without the use of an intermediate layer composed of air-displacing material, in particular heat-conducting material, or, if necessary, with the use of an intermediate layer composed of air-displacing material, in particular heat-conducting material, that is however only thin, with a maximum thickness<2 µm, wherein a) the heat absorption surface of the heat sink and/or the heat emission surface of the article to be cooled are/is machined in such a way that they/it have/has a roughness Ra<0.3 µm and/or a flatness<0.5 µm, and/or wherein b) the heat absorption surface of the heat sink and the heat emission surface of the article to be cooled are pressed against one another with a contact pressure of at least 0.05 N/mm².

An arrangement according to the invention is correspondingly characterized in that, in order to optimize the heat conduction between the heat sink and the article to be cooled, the heat absorption surface of the heat sink bears directly against the heat emission surface of the article to be cooled (metal-to-metal contact) without the use of an intermediate layer composed of air-displacing material (and in particular also without air and/or without a materially bonded connection of the heat emission surface to the heat absorption surface), or, if necessary, with the use of an intermediate layer composed of air-displacing material, in particular heat-conducting material, that is however only thin and that is in particular only present in certain regions, with a maximum thickness<2 µm, wherein a) the heat absorption surface of the heat sink and/or the heat emission surface of the article to be cooled are/is machined in such a way that they/it have/has a roughness Ra<0.3 µm and/or a flatness<0.5 µm, and/or wherein b) the heat absorption surface of the heat sink and the heat emission surface of the article to be cooled are pressed against one another with a contact pressure of at least 0.05 N/mm².

Surprisingly, it has been shown that the implementation of one of the aforementioned measures already results in heat conduction that is greatly improved compared with the prior art, and thus significantly improved cooling performance of the cooling device. A combination of these measures improves these effects even more.

According to the invention, suitable ultra-fine machining of the heat emission surface and of the heat absorption surface (for example by means of lapping, honing, diamond milling, etc.), by means of which the specified roughness and/or flatness values can be obtained, achieves a situation in which the metallic heat emission and heat absorption surfaces can contact one another directly, either in a full-area manner or at least in predominant subregions, without—by contrast to the prior art—air cushions building up between the surfaces, which air cushions would have to be displaced by a relatively thick layer of heat-conducting material, which would have an adverse effect with regard to the thermal conductivity. Correspondingly, it is possible according to the invention for the high thermal conductivity values of the metals involved to take effect directly. The background here is that conventional heat-conducting pastes generally have thermal conductivities which are in part 100 times lower than thermal conductivities of metals.

However, it is also within the scope of the invention, in the case of the specified roughness and/or flatness values, to also use a full-area or partial-area intermediate layer composed of the air-displacing material, in particular heat-conducting material, but which is or may be only very thin compared with the prior art, namely <2 µm.

Said intermediate layer may even have only a maximum thickness<40 nm, preferably <25 nm, particularly preferably <10 nm.

The air-displacing material of the intermediate layer may for example be heat-conducting paste or wax with or without particularly heat-conducting additions/additives, such as graphite particles.

As has furthermore been shown, the above-mentioned pressing according to the invention of the heat emission surface and the heat absorption surface with contact forces of >0.05 N/mm² alternatively or additionally also makes it possible to bring about such direct (complete or partial-area) metal-to-metal contact with the aforementioned advantages. Moreover, this pressing may compensate for roughnesses and/or flatnesses above the aforementioned values and thus also offer an individual measure for optimizing the heat conduction between the mentioned surfaces.

Particularly preferably, according to the invention, the heat absorption surface of the heat sink and/or the heat emission surface of the article to be cooled may even be subjected to (ultra-fine) machining in such a way that they/it have/has a roughness Ra<0.1 μm and/or a flatness<0.1 μm.

Moreover, the heat emission surface of the article to be cooled and the heat absorption surface of the heat sink advantageously lie opposite one another in a parallel manner.

According to a preferred refinement of the invention, the cooling device has at least two preferably rigid heat sinks which each have a (planar) heat absorption surface that is formed in particular by their underside and which are connected to one another in an articulated manner in particular by way of a heat sink joint, with the result that the two heat sinks, and with them the heat absorption surfaces, are movable relative to one another in different, in particular parallel planes, wherein each heat absorption surface of each heat sink bears directly against the respective heat emission surface of one of two articles to be cooled without the use of the respective intermediate layer composed of the air-displacing material, or, if necessary, with the use of the only thin intermediate layer composed of the air-displacing material.

As a result of this use of two heat sinks which are connected with one another in an articulated manner, and thus also two heat absorption surfaces which are connected in this way and which can be arranged on the respective article to be cooled, a cooling device is provided which can compensate for relatively large tolerances or distances between the (planar or flat) heat absorption surface or surfaces of the respective heat sink and the (planar or flat) heat emission surface or surfaces of the article or articles to be cooled, which tolerances or distances may otherwise arise due to the fact that, in the case of multiple separate heat emission surfaces, the latter do not run in a common plane, or due to the fact that, in relation to a respective heat emission surface, the latter has individual surface regions which run in different planes.

Consequently, it is also advantageously not necessary (any longer) to have to use heat-conducting paste of large layer thickness in order to bridge in particular such relatively large distances.

In this case, the heat emission surfaces of the two articles to be cooled may correspondingly be arranged in different, in particular parallel planes, wherein the planar heat absorption surfaces of the heat sinks, said heat absorption surfaces bearing against the heat emission surfaces, would then correspondingly likewise be arranged in different, in particular parallel planes.

With regard to the aforementioned heat sink joint, it may thus have two in particular parallel axes of rotation which are spaced apart from one another and about which the two heat sinks are movable, specifically pivotable, relative to one another in the different planes.

Furthermore, the heat sink joint may have a flexible, in particular pliable, joint portion of preferably plate-like form which is either integrally connected to the heat sinks and has a smaller material thickness than the two heat sinks, or is integrally connected to a base body, in particular composed of plastic, which is connected to the two heat sinks in particular in a fluid-tight manner.

The flexible joint portion may in each case adjoin, on two opposite sides, one of two connecting portions to which it is integrally connected, wherein each of the two connecting portions is in turn integrally connected to one of the two heat sinks, and wherein the thickness of each connecting portion in its region adjoining the joint portion corresponds to the thickness of the joint portion and wherein the thickness thereof proceeding therefrom in the direction of the heat sink to which it is integrally connected increases in particular in a continuous manner until it corresponds to the thickness of this heat sink.

The two axes of rotation of the heat sink joint may be arranged in the region of the opposite sides of the joint portion, which each adjoin the respective connecting portion, or on these sides.

In order to generate the contact pressure according to the invention (see above), the cooling device may comprise a clamping device by means of which the heat absorption surface of each heat sink can be pressed or is pressed against the heat emission surface of the article to be cooled or of the respective article to be cooled.

Moreover, the heat sink, together with the article or articles to be cooled, may be clamped or clampable in the clamping device, in particular between a first, in particular movable, preferably elastic clamping component and a second, in particular positionally fixed, clamping component.

In this case, the first clamping component may be pushable or pushed against the heat sinks by means of spring force.

Moreover, each heat sink may preferably be connected in a fixed and fluid-tight, in particular liquid-tight, manner to an in particular common base body which is preferably formed from plastic, in particular on that side of the respective heat sink which faces away from the respective heat absorption surface or surfaces, wherein the respective heat sink and the base body together completely or partially enclose the cooling fluid chamber or delimit it towards the outside.

Furthermore, the or each article to be cooled may be situated on a positionally fixed component of the cooling device, in particular either so as to bear directly against said cooling device on a preferably planar heat absorption surface (in particular composed of metal) of a positionally fixed second further heat sink of the cooling device, said further heat sink consisting in particular of solid material, being arranged at a distance from the (first) heat sinks and being intended to absorb heat from the articles to be cooled, or with the interposition of an intermediate layer composed of air-displacing, preferably paste-like material, in particular heat-conducting material, such as heat-conducting paste.

With regard to the cooling fluid chamber of the cooling device, it may thus preferably be formed from a plurality of fluid lines which are introduced, in particular milled, into the respective heat sink, or may comprise such fluid lines.

BRIEF DESCRIPTION OF THE DRAWINGS

Further features of the present invention will emerge from the attached patent claims, from the following description of preferred exemplary embodiments and from the attached drawings.

In the drawings.

DETAILED DESCRIPTION OF PREFERRED EMBODIMENTS

Figure 1:
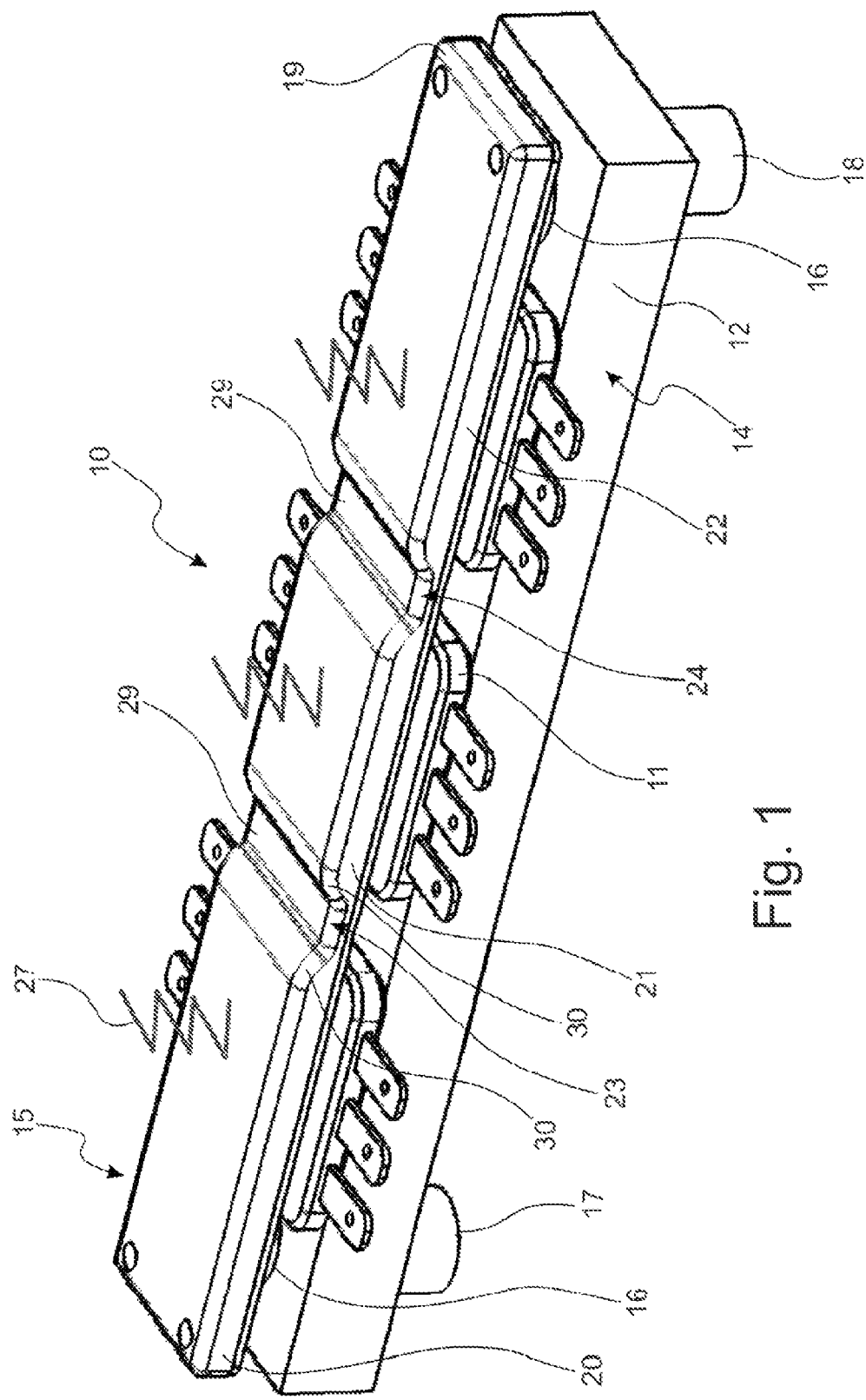
FIG. 1 shows an oblique view of an arrangement according to the invention comprising a cooling device and three articles to be cooled by said cooling device.

The arrangement shown in the figures has a cooling device 10 which is used to dissipate heat from articles 11 to be cooled, in the present case power electronic components (for instance inverter modules) as are used for example in connection with batteries or rechargeable batteries of electric vehicles.

The cooling device 10 has a lower heat sink 12 on which the articles 11 to be cooled are arranged or situated and which cools, or absorbs heat from, the undersides of the articles 11 to be cooled, and also has a plurality of, in the present case three, upper heat sinks 20, 21, 22 which each bear against the top sides of the articles 11 to be cooled and cool said articles or absorb heat from the top sides thereof.

In the present case, the lower heat sink 12 and the upper heat sinks 20, 21, 22 are each in the form of solid metal bodies, for example composed of aluminium.

The lower heat sink 12 is part of a lower cooling component 14 which has, in its interior (not shown), a cooling fluid chamber which is delimited towards the outside by the lower heat sink 12 and a base body which is produced for example from plastic, wherein the lower heat sink 12 and the base body assigned thereto are connected to one another (for instance in a materially bonded manner) in a fluid-tight, in the present case liquid-tight, manner. In the figures, for the sake of simplicity, the lower heat sink 12 of the lower cooling component 14 and the base body thereof are not depicted in individually resolved fashion in the drawings, but rather are illustrated as a complete unit or complete block.

The upper heat sinks 20, 21, 22 are part of an upper cooling component 15 which also has, in its interior, a cooling fluid chamber (not illustrated) which is delimited towards the outside on the one hand by the upper heat sinks 20, 21, 22 and on the other hand by a base body 19 which is for example also produced from plastic and which is collectively assigned to these upper heat sinks 20, 21, 22. The upper heat sinks 20, 21, 22 and the base body 19, which is collectively assigned thereto, of the upper cooling component 15 are also connected to one another (for instance in a materially bonded manner) in a fluid-tight, in the present case likewise liquid-tight, manner.

One or both cooling fluid chambers may for example consist of or comprise a plurality of fluid lines which are introduced, in particular milled, into the respective heat sinks 12 and 20, 21, 22.

In the present case, the lower cooling component 14 and the upper cooling component 15, more precisely the cooling fluid chambers of same, are connected to one another in a fluid-conducting manner by way of laterally arranged connecting lines 16 which run in particular perpendicularly with respect thereto.

The cooling device 10 furthermore has a medium inlet 17 and a medium outlet 18.

As a result, it is correspondingly possible for cooling fluid, which during operation of the cooling device 10 can dissipate the (waste) heat that the heat sinks 12 and 20, 21, 22 absorb from the articles 11 to be cooled, to be supplied via the medium inlet 17 initially to the lower cooling component 14 and subsequently also to the upper cooling component 15.

As a rule, the cooling fluid will be a cooling liquid. However, it goes without saying that it is also within the scope of the invention to use a gaseous medium as cooling fluid. The corresponding fluid-tight connections between the respective base body and the lower heat sink 12 and, respectively, the upper heat sinks 20, 21, 22 would then correspondingly have to be of gas-tight form.

According to the invention, the upper heat sinks 20, 21, 22 are in each case in particular connected to one another in pairwise fashion in an articulated manner, such that they are movable relative to one another. In this case, a first pair of the upper heat sinks 20, 21 are connected to one another in an articulated manner by way of a first heat sink joint 23, and a second pair of the upper heat sinks 21, 22 are connected to one another in an articulated manner by way of a second heat sink joint 24.

Each upper heat sink 20, 21, 22 has a respective planar underside which in each case forms an (outer) planar or flat heat absorption surface 25 which, during operation of the cooling device 10, bears against an opposite, in the present case likewise planar, heat emission surface 26, formed by the respective top side thereof, of the respective article 11 to be cooled or lies opposite said heat emission surface in a parallel manner.

The articulated connections of the upper heat sinks 20, 21, 22 make a particular tolerance compensation possible during abutment or arrangement of the respective upper heat sink 20, 21, 22 on the articles 11 to be cooled, as will be explained in more detail below.

Specifically, this for example also makes it possible to compensate for slightly larger differences in the height dimensions of the individual articles 11 to be cooled, the compensation of which for instance by means of heat-conducting paste would have an (excessively) adverse effect, on account of the layer thicknesses required therefor, with regard to the most optimized heat conduction possible.

In such a case of relatively large height differences (but also in other useful cases), it is then possible for the individual planar heat absorption surfaces 25 of the respective upper heat sinks 20, 21, 22 to be moved in different planes, such that, in spite of heat emission surfaces 26 of the articles 11 to be cooled that do not run in a common plane, said heat absorption surfaces then still lie directly opposite that (planar) heat emission surface 26 of the respective article 11 to be cooled which is respectively assigned thereto, in each case only with the smallest possible distance, if any, from said heat emission surface.

As has already been indicated above, the required movability between the individual upper heat sinks 20, 21, 22 is made possible by the heat sink joints 23 and 24.

Figure 3:
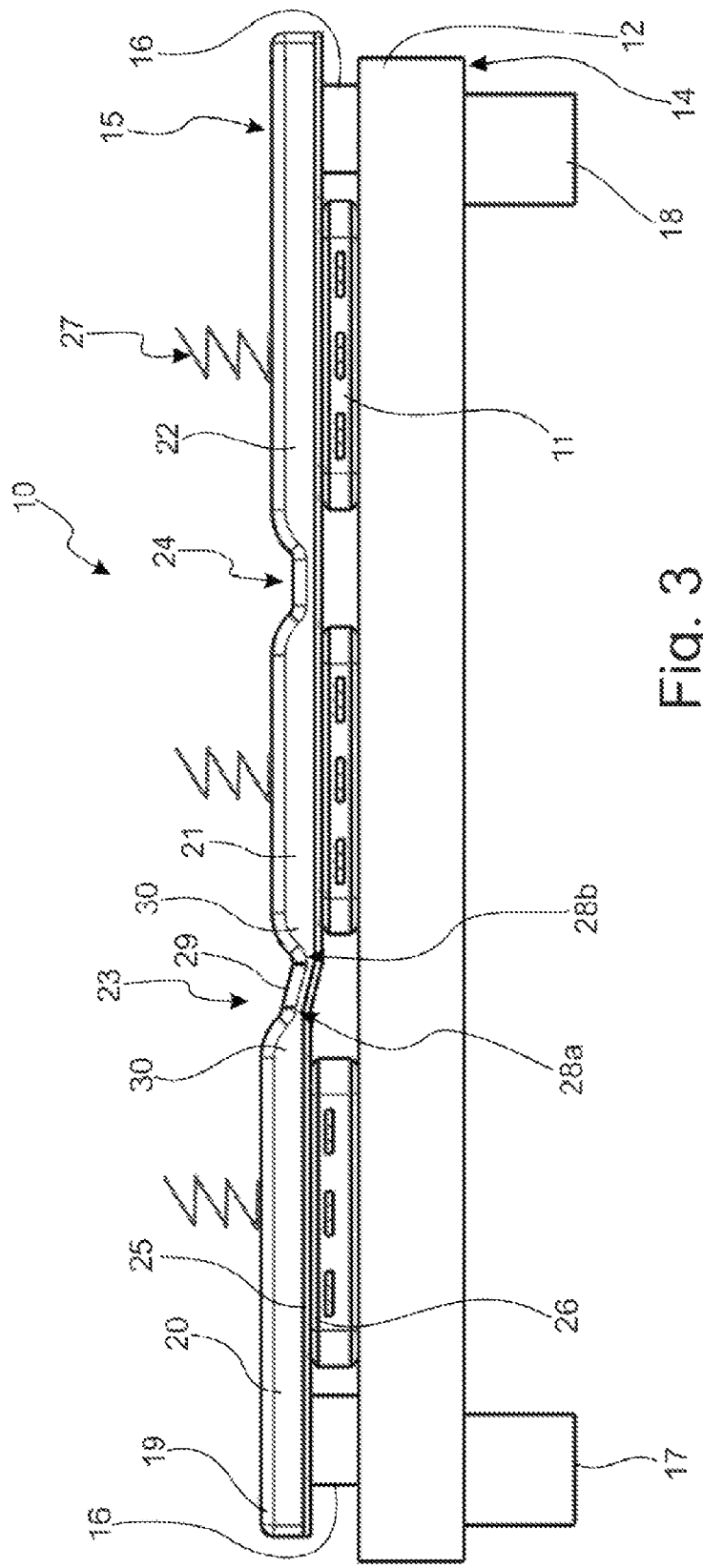
FIG. 3 shows the arrangement of FIG. 1, but with one of the three articles to be cooled having a greater height than the other two.

For further elucidation, FIG. 3 shows a situation in which one of the articles 11 to be cooled, namely the left-hand outer article 11 to be cooled, has a greater height than the two other articles 11 to be cooled. Correspondingly, the heat emission surface 26 thereof runs in a different (higher) plane than the heat emission surfaces 26 of the two other articles 11 to be cooled.

In order to compensate for this, the upper cooling component 15 has been deformed in comparison with the situation of FIG. 1, in which all the heat absorption surfaces 25 of the upper cooling component 15 or of the upper heat sinks 20, 21, 22 lie in a common plane, by application of pressure onto the upper cooling component 15 or directly onto the upper heat sinks 20, 21, 22. Forces 27 are schematically indicated which act from above on the upper cooling component 15 or correspondingly on the upper heat sinks 20, 21, 22 in order to bring about this deformation.

Specifically, these forces 27 act on the individual upper heat sinks 20, 21, 22 and in particular ensure a relative movement between the outer upper heat sink 20 and the adjacent, central upper heat sink 21.

For this purpose, the first and the second heat sink joint 23 and 24, respectively, each comprise a joint portion 29 which is integrally connected to the upper heat sinks 20, 21, 22 and which is for example of plate-like form. Said joint portion has a significantly smaller material thickness than the two upper heat sinks 20, 21 or 21, 22, respectively, that are connected to one another in an articulated manner by the respective heat sink joint 23 or 24, respectively.

In this case, the (smaller) material thickness is selected in such a way that the respective joint portion 29 is flexible (deformable) or pliable overall. Formed in the region of opposite sides of the respective joint portion 29 are in each case defined, parallel axes of rotation 28a and 28b which are spaced apart from one another, which in the present case run parallel to the plane of the respective heat absorption surface 25 and about which the heat sinks 20, 21, 22 can each be rotated (by deformation of the joint portion 29 in this region).

Moreover, in the region of the two opposite sides of the respective joint portion 29, the latter in each case adjoins a connecting portion 30 which is integrally connected to the two upper heat sinks 20, 21 or 21, 22, respectively, of a pair of adjacent heat sinks 20, 21, 22 and the thickness of which in its region adjoining the joint portion 29 corresponds to the thickness of the joint portion 29 and the thickness of which proceeding therefrom in the direction of the respective heat sink 20, 21 or 22 increases in particular in a continuous manner until it corresponds to the thickness of the heat sink 20, 21 or 22.

With regard to the above-mentioned relative movement between the outer upper heat sink 20 and the adjacent, central upper heat sink 21, said relative movement thus allows for corresponding orientation or movement of the individual heat sinks 20 and 21 in such a way that subsequently both the heat absorption surface 25 of the outer upper heat sink 20 and the heat absorption surface 25 of the central upper heat sink 21 bear in each case against that heat emission surface 26 of the respective article 11 to be cooled which is assigned thereto (FIG. 3).

In the present example, the aforementioned forces 27 are applied by a clamping device (not illustrated) in which the lower and the upper cooling component 14 and 15, respectively, together with the articles 11 to be cooled which are arranged between them, are clamped between a first, in particular movable, clamping component preferably in the form of a spring and a second, in particular positionally fixed, clamping component.

Moreover, provision may also be made for the lower cooling component 14 to simultaneously form the second, positionally fixed clamping component, for example.

Figure 2:
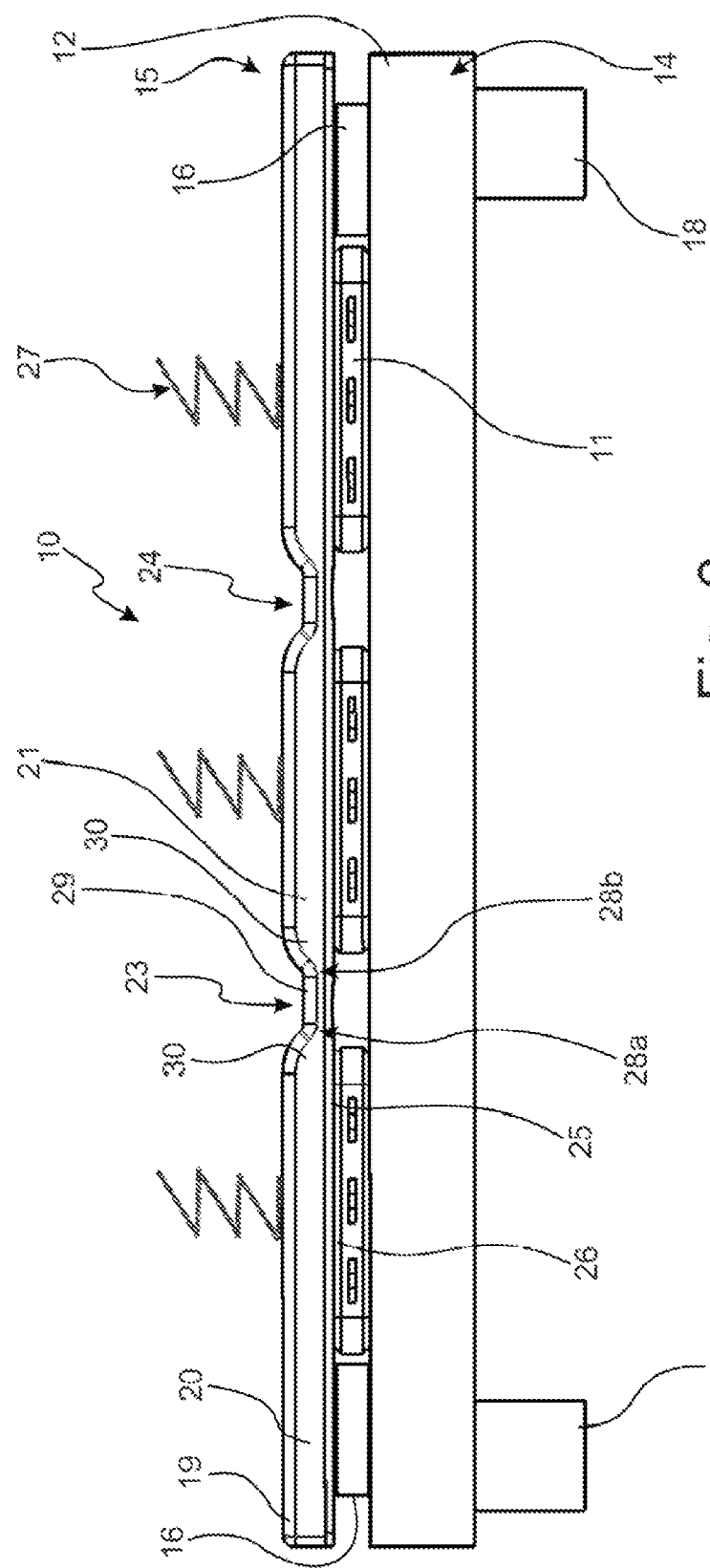
FIG. 2 shows a side view of the cooling device from FIG. 1.
Figure 4:
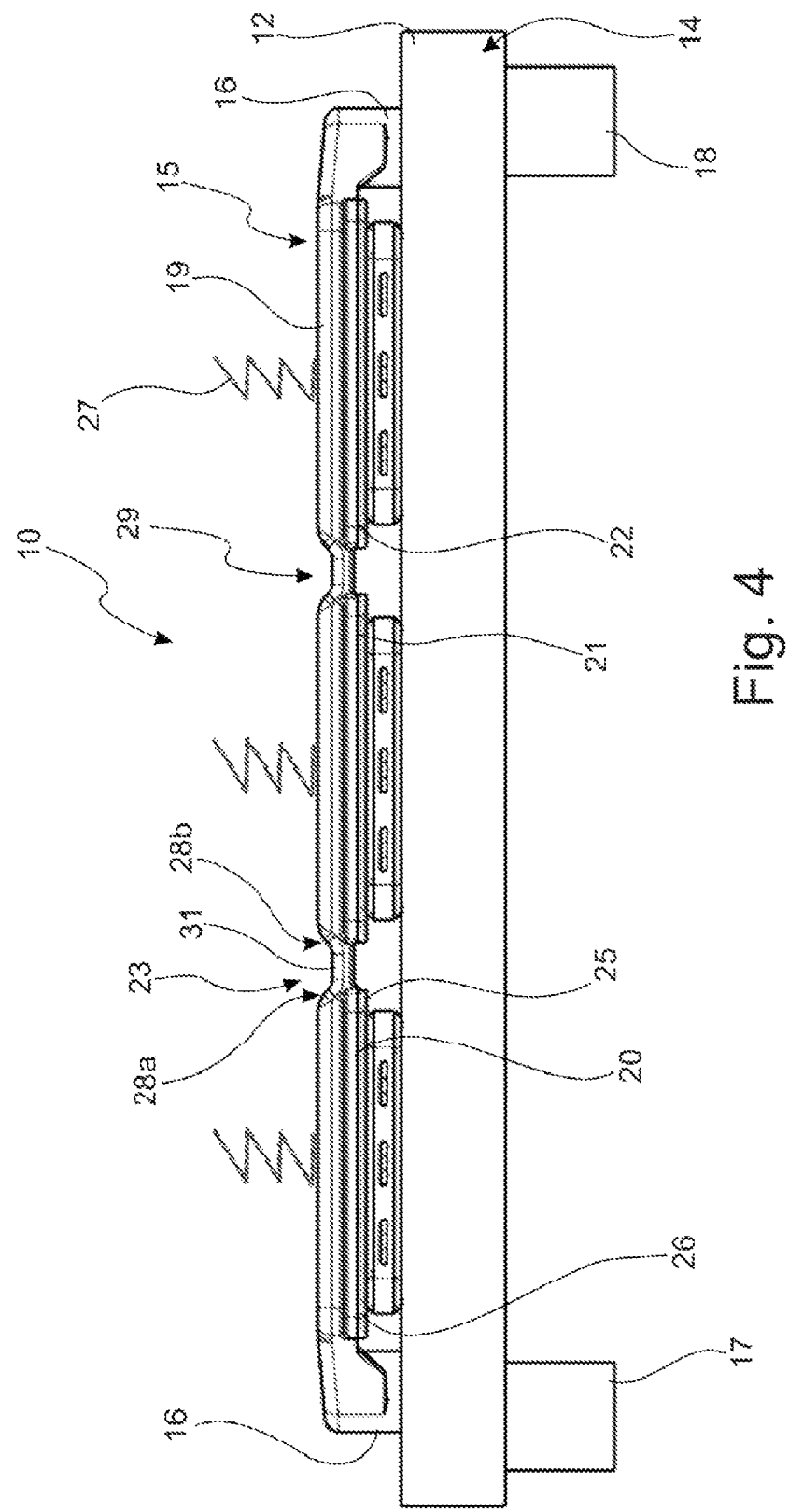
FIG. 4 shows a further embodiment of a cooling device according to the invention in a side view similar to FIG. 2.

FIG. 4 shows an embodiment of a cooling device 10 according to the invention in which the individual heat sinks 20, 21, 22 are connected to one another in an articulated manner in a different way than in FIGS. 1-3. Specifically not directly by way of a joint portion 29 or connecting portion 30 which is integrally connected thereto, but only indirectly by way of a flexible joint portion 31 which is arranged between the pairs of heat sinks 20, 21 and 21, 22, respectively, and which in this case forms part of or is integrally connected to the plastics base body 19 which is connected (in a fluid-tight manner) to the upper heat sinks 20, 21, 22.

In this case, insofar as material is concerned, the upper heat sinks 20, 21, 22 are separate or separately produced components which have been or are connected to one another (only) by the common base body 19, whereas in the embodiment of FIGS. 1-3 they are produced from a common material or metal block into which the connecting portions 30 or the joint portions 29 have been or are incorporated by suitable machining of the material block, such that the upper heat sinks 20, 21, 22 are correspondingly integrally connected to one another as a result.

In particular, according to the invention, the heat conduction between the heat emission surfaces 26 and the heat absorption surfaces 25 is further optimized.

Both the heat emission surfaces 26 and the heat absorption surfaces 25 are made to be ultra-planar by means of ultra-fine machining, such as lapping, honing, diamond milling, and have roughness values Ra<0.3 µm and/or flatness values<0.5 µm.

In combination with a contact pressure of at least 0.05 N/mm$^2$, by means of which the heat absorption surfaces 25 and the heat emission surfaces 26 are correspondingly pressed against one another and which is applied by means of the clamping device, this has the result, as has already been described in detail in the introduction of this application, that the metal of the heat emission surface 26 and the metal of the heat absorption surface 25 contact one another directly, either in a full-area manner or at least in predominant subregions, without—by contrast to the prior art—air cushions building up between the surfaces 25 and 26, which air cushions would otherwise have to be displaced by a relatively thick layer of air-displacing material, in particular heat-conducting material, which would have an adverse effect with regard to the thermal conductivity.

It is therefore possible to dispense with such an intermediate layer composed of material that inherently or due to the nature of the material frequently has much poorer conductivity than pure metal-to-metal contact. If such an intermediate layer is still used, it can be of very thin form on account of the roughness and/or flatness values according to the invention and/or the contact pressure according to the invention and can for example have only a maximum thickness<2 µm.

LIST OF REFERENCE DESIGNATIONS

10 Cooling device
11 Article to be cooled
12 Lower heat sink
14 Lower cooling component 15 Upper cooling component
16 Connecting line
17 Medium inlet
18 Medium outlet
19 Base body of upper cooling component
20 Outer upper heat sink
21 Central upper heat sink
22 Outer upper heat sink
23 First heat sink joint
24 Second heat sink joint
25 Heat absorption surface
26 Heat emission surface
27 Force
28a Axis of rotation
28b Axis of rotation
29 Joint portion
30 Connecting portion
31 Joint portion

What is claimed is:

1. An arrangement comprising a cooling device for dissipating heat from articles to be cooled, the cooling device comprising:
a base body;
a rigid first heat sink that has a planar heat absorption surface composed of metal and that is intended to absorb heat from the article to be cooled, wherein the first heat sink is connected in a fixed and fluid-tight manner to the base body; and
a cooling fluid chamber for accommodating a cooling fluid to which the heat absorbed by the first heat sink can be transferred, the article to be cooled having a planar heat emission surface composed of metal, the cooling fluid chamber being at least partially enclosed by the first heat sink being connected in a fixed and fluid-tight manner to the base body so as to accommodate the cooling fluid, the cooling fluid chamber being delimited by the base body which is formed from plastic on a side of the first heat sink which faces outside and away from the heat absorption surface,
wherein, in order to optimize the heat conduction between the first heat sink and the article to be cooled, the heat absorption surface of the first heat sink bears directly against the heat emission surface of the article to be cooled either without the use of an intermediate layer composed of air-displacing, heat-conducting material, or with the use of an intermediate layer composed of an air-displacing, heat-conducting material having a maximum thickness<2 µm,
wherein at least one of (a) the heat absorption surface of the first heat sink and (b) the heat emission surface of the article to be cooled is machined to a roughness Ra<0.3 µm and a flatness<0.5 µm, and
wherein the heat absorption surface of the first heat sink and the heat emission surface of the article to be cooled are pressed against one another with a contact pressure of at least 0.05 N/mm².

2. The arrangement according to claim 1, wherein at least one of the heat absorption surface of the first heat sink and the heat emission surface of the article to be cooled is machined to a roughness Ra<0.1 µm and/or a flatness<0.1 µm.

3. The arrangement according to claim 1, wherein if the intermediate layer composed of the air-displacing, heat-conducting material is present, the air-displacing, heat-conducting material has a maximum thickness<40 nm.

4. The arrangement according to claim 1, wherein the heat emission surface of the article to be cooled and the heat absorption surface of the first heat sink lie opposite one another in a parallel manner.

5. The arrangement according to claim 1, wherein the cooling device further comprises a rigid second heat sink, wherein the two heat sinks are for cooling at least two of the articles to be cooled, with each of the two heat sinks having a planar heat absorption surface that is formed by their underside and which are connected to one another in an articulated manner by way of a heat sink joint, with the result that the two heat sinks, and with the two heat sinks the heat absorption surfaces, are movable relative to one another in different, parallel planes, wherein each heat absorption surface of each of the two heat sinks bears (a) directly against a respective heat emission surface of a respective one of the at least two articles to be cooled without the use of a respective intermediate layer composed of the air-displacing, heat-conducting material, or (b) against a respective heat emission surface of the respective one of the articles to be cooled with the use of the intermediate layer composed of the air-displacing, heat-conducting material.

6. The arrangement according to claim 5, wherein the heat emission surfaces of the two articles to be cooled are arranged in different parallel planes, and in that the planar heat absorption surfaces of the two heat sinks, said heat absorption surfaces bearing against the heat emission surfaces, are correspondingly likewise arranged in the different parallel planes.

7. The arrangement according to claim 5, wherein the heat sink joint has two parallel Axes of rotation which are spaced apart from one another and about which the two heat sinks are pivotable relative to one another in the different parallel planes.

8. The arrangement according to claim 5, wherein the heat sink joint has a flexible joint portion of plate-like form which is either integrally connected to the two heat sinks and has a smaller material thickness than the two heat sinks, or is integrally connected to the base body which is connected to the two heat sinks in a fluid-tight manner.

9. The arrangement according to claim 8, wherein the flexible joint portion in each case adjoins, on two opposite sides, one of two connecting portions to which the flexible joint portion is integrally connected, wherein each of the two connecting portions is in turn integrally connected to one of the two heat sinks, and wherein the thickness of each of the two connecting portions in its region adjoining the joint portion corresponds to the thickness of the joint portion and wherein the thickness of the joint portion proceeding therefrom in the direction of the heat sink to which the joint portion is integrally connected increases in a continuous manner until the thickness of the joint portion corresponds to the thickness of the heat sink to which the joint portion is integrally connected.

10. The arrangement according to claim 8, wherein the heat sink joint has two axes of rotation that are arranged in the region of the opposite sides of the joint portion, which opposite sides each adjoin a respective connecting portion.

11. The arrangement according to claim 5, wherein each of the articles to be cooled is situated on a positionally fixed component of the cooling device either so as to bear directly against said cooling device on the planar heat absorption surface of the second heat sink, which is positionally fixed, said second heat sink consisting of solid material, being arranged at a distance from the first heat sink and being intended to absorb heat from the articles to be cooled, or with the interposition of the intermediate layer composed of the air-displacing, heat-conducting material.

12. The arrangement according to claim 5, wherein the two heat sinks are connected in a fixed and fluid-tight manner to the base body on sides of the two heat sinks which face away from the respective heat absorption surface, wherein the two heat sinks and the base body together at least partially enclose the cooling fluid chamber or delimit the cooling fluid chamber towards the outside.

13. The arrangement according to claim 1, wherein the intermediate layer composed of the air-displacing, heat-conducting material has a maximum thickness<25 nm.

14. The arrangement according to claim 1, wherein the intermediate layer composed of the air-displacing, heat-conducting material has a maximum thickness<10 nm.

15. An arrangement comprising a cooling device for dissipating heat from articles to be cooled, the cooling device comprising:
- a base body;
- a plurality of rigid heats sinks that each have a planar heat absorption surface composed of metal and that is intended to absorb heat from the articles to be cooled, wherein the heat sinks are connected in a fixed and fluid-tight manner to the base body; and
- a cooling fluid chamber for accommodating a cooling fluid to which the heat absorbed by the heat sinks can be transferred, the articles to be cooled each having a planar heat emission surface composed of metal, the cooling fluid chamber being at least partially enclosed by the heat sinks being connected in a fixed and fluid-tight manner to the base body so as to accommodate the cooling fluid, the cooling fluid chamber being delimited by the base body which is formed from plastic on a side of the heat sinks which faces outside and away from the heat absorption surface,
wherein, in order to optimize the heat conduction between the heat sinks and the articles to be cooled, the heat absorption surfaces of the heat sinks bear directly against the heat emission surfaces of the articles to be cooled either without the use of an intermediate layer composed of air-displacing, heat-conducting material, or with the use of an intermediate layer composed of an air-displacing, heat-conducting material having a maximum thickness<2 µm,
wherein at least one of (a) the heat absorption surfaces of the heat sinks and (b) the heat emission surfaces of the articles to be cooled is machined to a roughness Ra<0.3 µm and a flatness<0.5 µm, and
wherein the heat absorption surfaces of the heat sinks and the heat emission surfaces of the articles to be cooled are pressed against one another with a contact pressure of at least 0.05 N/mm².

16. The arrangement according to claim 15, wherein at least one of (a) the heat absorption surfaces of the heat sinks and (b) the heat emission surfaces of the articles to be cooled is machined to a roughness Ra<0.1 µm and/or a flatness<0.1 µm.

17. The arrangement according to claim 15, wherein if the intermediate layer composed of the air-displacing, heat-conducting material is present, the air-displacing, heat-conducting material has a maximum thickness<40 nm.

18. The arrangement according to claim 15, wherein two of the heat sinks are connected to one another in an articulated manner by way of a heat sink joint, with the result that the two heat sinks, and with the two heat sinks the heat absorption surfaces, are movable relative to one another in different, parallel planes, wherein each heat absorption surface of each of the two heat sinks bears (a) directly against a respective heat emission surface of a respective one of the articles to be cooled without the use of a respective intermediate layer composed of the air-displacing, heat-conducting material, or (b) against a respective heat emission surface of the respective one of the articles to be cooled with the use of the intermediate layer composed of the air-displacing, heat-conducting material.

\* \* \* \* \*